US011026347B2

United States Patent
Wong et al.

(10) Patent No.: US 11,026,347 B2
(45) Date of Patent: Jun. 1, 2021

(54) CONFIGURABLE COOLING FOR RUGGED ENVIRONMENTS

(71) Applicant: Emerson Network Power—Embedded Computing, Inc., Tempe, AZ (US)

(72) Inventors: Suzanne Marye Wong, Tempe, AZ (US); Martin Peter John Cornes, Phoenix, AZ (US); Robert Charles Tufford, Chandler, AZ (US)

(73) Assignee: SMART Embedded Computing, Inc., Tempe, AZ (US)

( * ) Notice: Subject to any disclaimer, the term of this patent is extended or adjusted under 35 U.S.C. 154(b) by 547 days.

(21) Appl. No.: 13/724,952

(22) Filed: Dec. 21, 2012

(65) Prior Publication Data

US 2014/0174693 A1 Jun. 26, 2014

(51) Int. Cl.
*H05K 7/20* (2006.01)

(52) U.S. Cl.
CPC ..... *H05K 7/20409* (2013.01); *H05K 7/20009* (2013.01); *H05K 7/209* (2013.01); *H05K 7/20418* (2013.01)

(58) Field of Classification Search
CPC ........... H05K 7/20409; H05K 7/20709; H05K 7/20645; H05K 7/20418; H05K 7/20254; H05K 7/20536; H05K 7/20627; H05K 7/20654; H05K 7/20854; H05K 7/20872; H05K 7/2089; H05K 7/20927; H05K 7/20918; H05K 7/2039; H05K 7/20445;
(Continued)

(56) References Cited

U.S. PATENT DOCUMENTS 1,921,806 A * 8/1933 Carlson ..................... F28F 3/12
                           123/142.5 R
2,690,653 A * 10/1954 Kleist ..................... F25D 3/005
                             114/74 R
(Continued)

FOREIGN PATENT DOCUMENTS

| CN | 2932929 Y | 4/1960 |
|---|---|---|
| CN | 1237083 A | 12/1999 |
| CN | 2443582 Y | 8/2001 |

OTHER PUBLICATIONS

Chinese Office Action and Search Report for Application No. 2013107175549 dated Dec. 28, 2015, and its English translation thereof.

*Primary Examiner* — Joel M Attey
*Assistant Examiner* — For K Ling
(74) *Attorney, Agent, or Firm* — Harness, Dickey & Pierce, P.L.C.

(57) ABSTRACT

A configurable electronics cabinet cooling system includes a cabinet having multiple walls including at least one universal cabinet wall. The universal cabinet wall has a planar outward facing surface and multiple apertures. A heat transfer component is releasably connected to the universal cabinet wall. The heat transfer component is selected from either a conductive cooling member or a convective cooling member each adapted to be interchangeably and releasably connected to the universal cabinet wall using fasteners extending through same ones of the apertures. Each of the conductive cooling member and the convective cooling member includes a planar surface, the planar surface adapted to directly contact the outward facing surface of the universal cabinet wall.

13 Claims, 4 Drawing Sheets

(58) Field of Classification Search
CPC ............... H05K 7/205; H05K 7/20509; H05K 7/20263; H05K 7/20218; H01L 23/467; H01L 23/473; H01L 2023/405; H01L 2023/4062; F28F 1/04; F28F 1/006; F28F 3/06; F28F 13/08; F28F 3/12
USPC ..... 165/80.2–80.4, 137, 147, 157, 168, 169, 165/178, 171; 361/679.49, 699, 697, 698, 361/702, 704, 720
See application file for complete search history.

(56) References Cited

U.S. PATENT DOCUMENTS

| | | | | |
|---|---|---|---|---|
| 4,339,260 | A * | 7/1982 | Johnson | C03B 9/38 361/702 |
| 4,765,397 | A * | 8/1988 | Chrysler | H01L 23/473 165/104.33 |
| 4,953,634 | A * | 9/1990 | Nelson | F28F 3/02 165/147 |
| 5,309,315 | A * | 5/1994 | Naedel | H05K 7/1427 174/386 |
| 5,370,178 | A * | 12/1994 | Agonafer | H01L 23/467 165/137 |
| 5,482,109 | A * | 1/1996 | Kunkel | H05K 7/20254 165/185 |
| 5,482,113 | A * | 1/1996 | Agonafer | F28D 1/024 165/122 |
| 5,985,483 | A * | 11/1999 | Verhoog | H01M 2/1077 429/120 |
| 6,400,012 | B1 * | 6/2002 | Miller | H01L 23/473 257/712 |
| 6,411,515 | B1 * | 6/2002 | Sakamoto | H04B 1/74 165/185 |
| 6,462,949 | B1 * | 10/2002 | Parish, IV | F28D 15/0266 165/80.4 |
| 6,588,647 | B2 * | 7/2003 | Yamada | H05K 7/20872 165/170 |
| 6,618,250 | B2 * | 9/2003 | Nealis | H05K 5/0213 165/80.3 |
| 6,752,203 | B2 * | 6/2004 | Kurita | F24D 5/10 165/168 |
| 7,209,348 | B2 * | 4/2007 | Yazawa | H05K 7/20445 165/185 |
| 7,310,737 | B2 * | 12/2007 | Patel | H05K 7/20736 713/300 |
| 7,418,995 | B2 * | 9/2008 | Howard | H05K 7/20918 165/121 |
| 7,450,384 | B2 * | 11/2008 | Tavassoli | H05K 7/20636 165/80.4 |
| 7,679,909 | B2 * | 3/2010 | Spearing | E05D 11/00 165/80.4 |
| 8,472,184 | B2 * | 6/2013 | Chang | H05K 7/20418 165/104.21 |
| 8,477,498 | B2 * | 7/2013 | Porreca | H05K 7/1404 361/696 |
| 8,611,088 | B2 * | 12/2013 | Barna | H05K 7/20918 165/104.33 |
| 8,800,640 | B2 * | 8/2014 | Vaatainen | H01L 23/473 165/146 |
| 8,933,557 | B2 * | 1/2015 | Gohara | H01L 23/3735 165/168 |
| 9,451,728 | B2 * | 9/2016 | Limbacher | H02B 1/28 |
| 2002/0030981 | A1 * | 3/2002 | Sullivan | G06F 1/184 361/829 |
| 2003/0034148 | A1 * | 2/2003 | Oyamada | H05K 5/068 165/46 |
| 2008/0117595 | A1 * | 5/2008 | Kramer | H05K 7/20609 361/697 |
| 2008/0144344 | A1 * | 6/2008 | Spencer | H05K 7/20918 363/141 |
| 2008/0218980 | A1 * | 9/2008 | Tracewell | H05K 7/20672 361/713 |
| 2009/0067128 | A1 * | 3/2009 | Kunz | G06F 1/20 361/679.53 |
| 2009/0310301 | A1 * | 12/2009 | Nelson | H05K 7/20163 361/695 |
| 2010/0302715 | A1 * | 12/2010 | Bortoli | H01H 9/52 361/676 |
| 2011/0176274 | A1 * | 7/2011 | Sevakivi | F28D 15/02 361/692 |
| 2011/0222246 | A1 * | 9/2011 | Hsieh | H05K 7/205 361/720 |
| 2012/0063084 | A1 * | 3/2012 | Fowler | H05K 7/1418 361/690 |
| 2013/0343002 | A1 * | 12/2013 | Kim | H05K 7/20927 361/717 |

* cited by examiner

CONFIGURABLE COOLING FOR RUGGED ENVIRONMENTS

FIELD

The present disclosure relates to cooling systems for electrical component cabinets and chassis.

BACKGROUND

This section provides background information related to the present disclosure which is not necessarily prior art.

Portable and field operative electronic component cabinets and chassis such as for card cages and radio equipment often require their internal components to be sealed from atmospheric contaminants, moisture, dirt and the like for use in rugged environments, such as for military equipment exposed to multiple different environments. This limits or prevents the use of flow through ventilation to remove equipment generated heat. Known solutions include the use of external cooling components that either conductively or convectively dissipate heat generated by the internal components through a sealed wall of the cabinet or chassis.

Commonly known component cabinets and chassis designs provide cooling plates that are uniquely designed to suit the arrangement of internally mounted components when conduction cooling is available/desired. Other known component cabinets and chassis typically provide unique heat exchange features such as cooling fins and the like to suit the arrangement of internally mounted components when convection cooling is desired or most efficient. Known cabinets or chassis are adapted for unique internal component configurations and heat loads, therefore known cooling systems such as convection and conduction cooling systems are not interchangeable on the same cabinet or chassis.

SUMMARY

This section provides a general summary of the disclosure, and is not a comprehensive disclosure of its full scope or all of its features.

According to several aspects, a configurable electronics cabinet cooling system includes a cabinet including at least one universal cabinet wall having a planar outward facing surface and multiple apertures. One of a conductive cooling member or a convective cooling member is interchangeably connected to the universal cabinet wall using same ones of the apertures. Each of the conductive cooling member and the convective cooling member include a planar surface. The planar surface is adapted to directly contact the outward facing surface of the universal cabinet wall.

According to further aspects, a configurable electronics cabinet cooling system includes a cabinet having multiple walls including at least one universal cabinet wall. The universal cabinet wall has a planar outward facing surface and multiple apertures. A heat transfer component is releasably connected to the universal cabinet wall. The heat transfer component is selected from either a conductive cooling member or a convective cooling member each adapted to be interchangeably and releasably connected to the universal cabinet wall using fasteners extending through same ones of the apertures. Each of the conductive cooling member and the convective cooling member includes a planar surface, the planar surface adapted to directly contact the outward facing surface of the universal cabinet wall.

According to other aspects, a configurable electronics cabinet cooling system includes a cabinet having multiple walls and a cooling assembly. The cooling assembly includes a universal cabinet wall defining one of the multiple walls. The universal cabinet wall has a planar outward facing surface and multiple component spacing members oppositely facing with respect to the outward facing surface. A heat transfer component is releasably connected to the outward facing surface of the universal cabinet wall. The heat transfer component is selected from either a conductive cooling member or a convective cooling member each adapted to be interchangeably and releasably connected to the universal cabinet wall.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
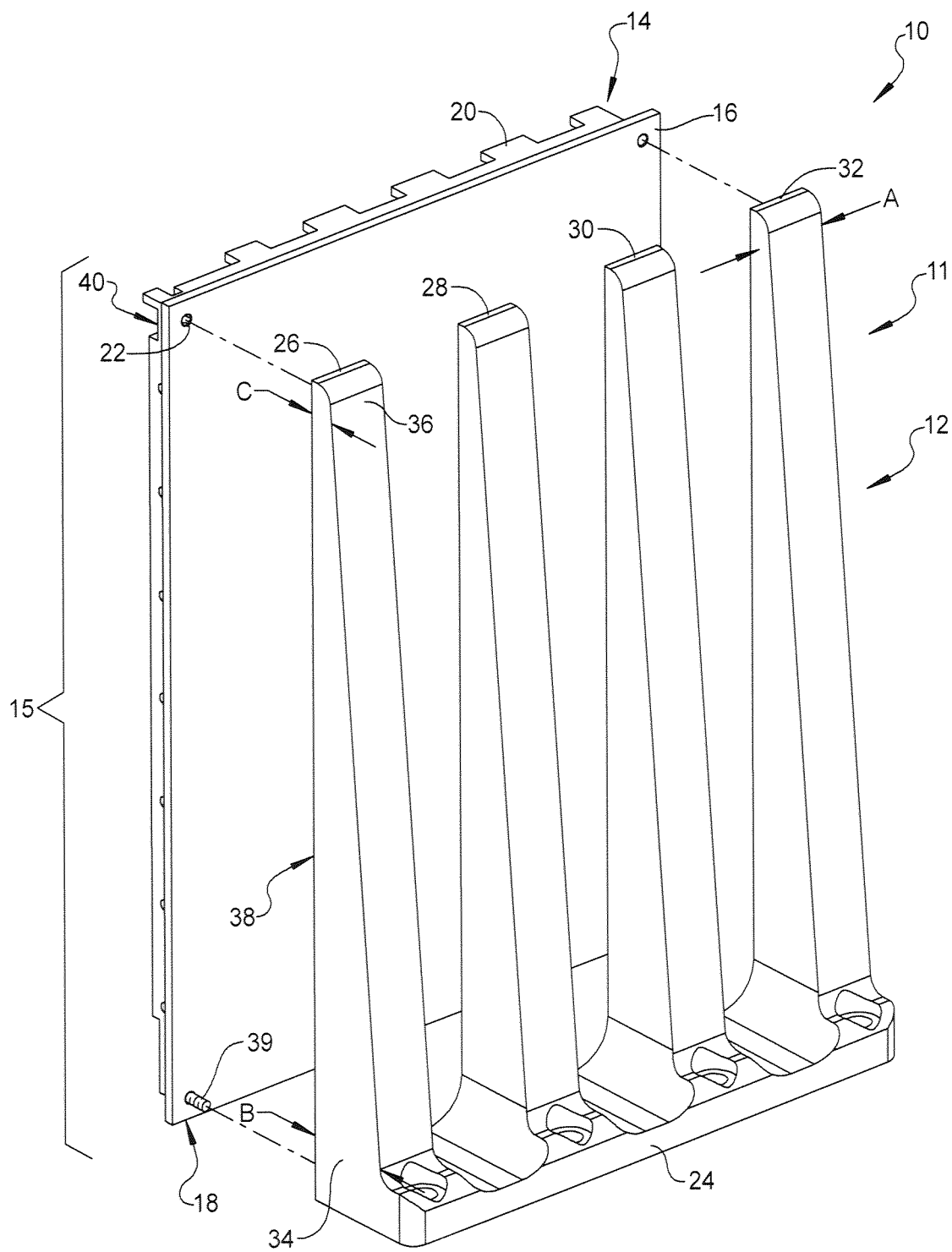
FIG. 1 is an exploded front left perspective view of a universal cabinet wall of the present disclosure providing for removable/replaceable use of a conductive cooling system.

Referring to FIG. 1, a configurable cooling system 10 includes a releasably connected heat transfer component 11. According to several aspects, the heat transfer component 11 is a conduction cooling member 12 releasably connected to a cabinet panel such as a universal cabinet wall 14, together defining a cooling assembly 15. The universal cabinet wall 14 includes a heat transfer component attachment side 16 having an outward facing planar surface 18 which is directed toward an external or ambient side to affect cooling. Universal cabinet wall 14 further includes at least one and according to several embodiments multiple component spacing members 20 oppositely facing with respect to planar surface 18. A plurality of apertures 22 is created through universal cabinet wall 14 to allow for releasable attachment of the conduction cooling member 12.

Conduction cooling member 12 includes a coolant header 24 through which a coolant, such as air or water, can be circulated. Multiple conductive cooling channels are integrally connected to and internally communicate with coolant header 24. In the embodiment shown, conduction cooling member 12 includes first, second, third, and fourth conductive cooling channels 26, 28, 30, 32 extending substantially transversely with respect to coolant header 24. Each of the conductive cooling channels includes a channel base 34, at its connection with connecting header 24, and a channel terminal end 36 spaced away from connecting header 24. Each of the conductive cooling channels 26, 28, 30, 32 have a channel planar surface 38 all aligned coplanar with each other such that each of the channel planar surfaces 38 will simultaneously contact the planar surface 18 of universal cabinet wall 14 to maximize heat transfer. Conduction cooling member 12 can be releasably connected to universal cabinet wall 14 using multiple fasteners 39 individually extending through the apertures 22. For example, the fasteners 39 can be bolts having bolt heads positioned on an electrical component attachment side 40 of universal cabinet wall 14 with threaded shanks extending toward conduction cooling member 12 which are threadably received in the conduction cooling member 12.

Each of the first, second, third, and fourth conductive cooling channels 26, 28, 30, 32 has a common channel width "A", a common channel base depth "B" proximate to the connecting header 24, and a common channel end depth "C" at the channel terminal ends 36. According to one embodiment shown, the first, second, third, and fourth conductive cooling channels 26, 28, 30, 32 taper from a maximum width defined by channel base depth "B" to a minimum width defined by channel end depth "C"; however, the geometry of the conductive cooling channels can vary from that shown based on a size required to transfer a heat load of the components mounted to universal cabinet wall 14. In addition, each of the first, second, third, and fourth conductive cooling channels 26, 28, 30, 32 can be open at the channel planar surfaces 38 where the channel planar surfaces 38 contact the planar surface 18, or the conductive cooling channels can have a closed wall defining the channel planar surface 38. It should also be evident that less than four or more than four conductive cooling channels can be provided with conduction cooling member 12 without varying from the scope of the present disclosure.

Referring to FIG. 2 and again to FIG. 1, with the individual conduction cooling members 12, 12' connected to individual ones of the universal cabinet walls 14, 14' for example in the opposed relationship shown, the universal cabinet walls 14, 14' define outer boundaries of a conduction cooled component chassis or cabinet 41 which is shown in an assembled condition. In the embodiment shown, first and second conduction cooling members 12, 12' are oppositely directed such that first conduction cooling member 12 is connected to a first cabinet edge 42 of conduction cooled component cabinet 41. A top panel or cabinet top 44 separates the first and second conduction cooling members 12, 12'. A modified universal cabinet wall 14 having the geometry of cabinet top 44 can be substituted for cabinet top 44, such that a modified conduction cooling member or a modified convection cooling member (modified from convection cooling member 52 described in reference to FIG. 3) can be attached to the cabinet top panel. The second conduction cooling member 12' is connected at a second cabinet edge 46 which according to several embodiments is oriented parallel with respect to first cabinet edge 42.

Additional cabinet panels, such as a blank cabinet panel 48, are provided to create front and back cabinet walls of conduction cooled component cabinet 41. A rear cabinet panel (not visible in this view) can be connected at a third cabinet edge 50. A universal cabinet wall modified from universal cabinet wall 14 to provide the necessary geometry can be substituted for any of the cabinet top 44, the blank cabinet panel 48 or the rear cabinet panel to permit installation of a conduction cooling member or a convection cooling member of the present disclosure. Universal cabinet walls similar to universal cabinet wall 14 can also be used for all of the cabinet walls defining a cabinet of the present disclosure. Any of the cabinet panels, including universal cabinet walls 164, 164' and blank cabinet panel 48, can be removed for access to electrical components within conduction cooled component cabinet 41.

Figure 2:
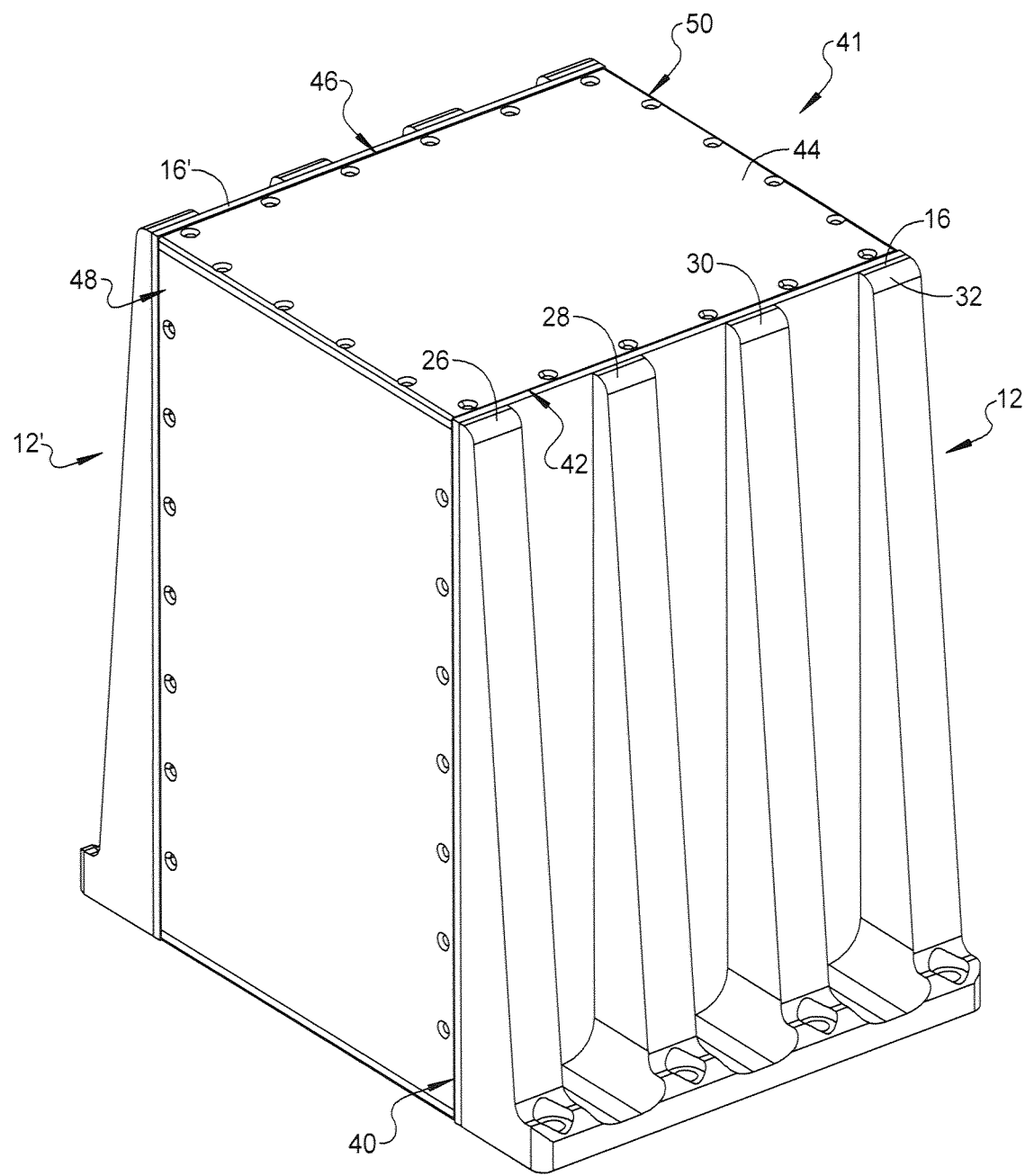
FIG. 2 is a front left perspective view of an assembled cabinet having the universal cabinet wall and conductive cooling system of FIG. 1 in an assembled condition.

Referring to FIG. 3 and again to FIGS. 1-2, according to additional aspects, the heat transfer component 11 is a convection cooling member 52. The same universal cabinet wall 14 previously described herein having one of the conduction cooling members 12 connected thereto, is also adapted to alternately receive one of the convection cooling members 52. Each of the convection cooling members 52 is connected in the same manner using the same apertures 22 as the conduction cooling members 12. The convection cooling members 52 each include a support plate 54 from which integrally extend multiple cooling fins 56 which are equally spaced to maximize convective heat transfer of a heat load dissipated through support plate 54. The convection cooling members 52 are positioned in direct contact with planar surface 18 of universal cabinet wall 14. According to several aspects, the individual cooling fins 56 are substantially identical to each other. According to other aspects, the individual cooling fins 56 are substantially identical to each other except for first and second end fins 58, 60 which are thicker to provide additional protection from environmental hazards.

A planar surface 62 of support plate 54 is oppositely directed with respect to the cooling fins 56 and has a surface area substantially equal to a surface area of planar surface 18, and is adapted to be positioned in direct contact with planar surface 18 to maximize convective heat transfer through planar surface 18. It is noted that any of the universal cabinet walls 14 can have either a conduction cooling member 12 or a convection cooling member 52 releasably connected thereto. This provides the capability of interchanging convective or conductive heat transfer elements for the same cabinet, depending on the cabinet heat load and/or the ambient conditions. This also provides the capability of pre-assembling multiple cabinets using one or more universal cabinet walls 14 and adapting the cabinets as necessary by subsequent installation of either conduction cooling member 12 or convection cooling member 52 on the universal cabinet walls 14.

Figure 3:
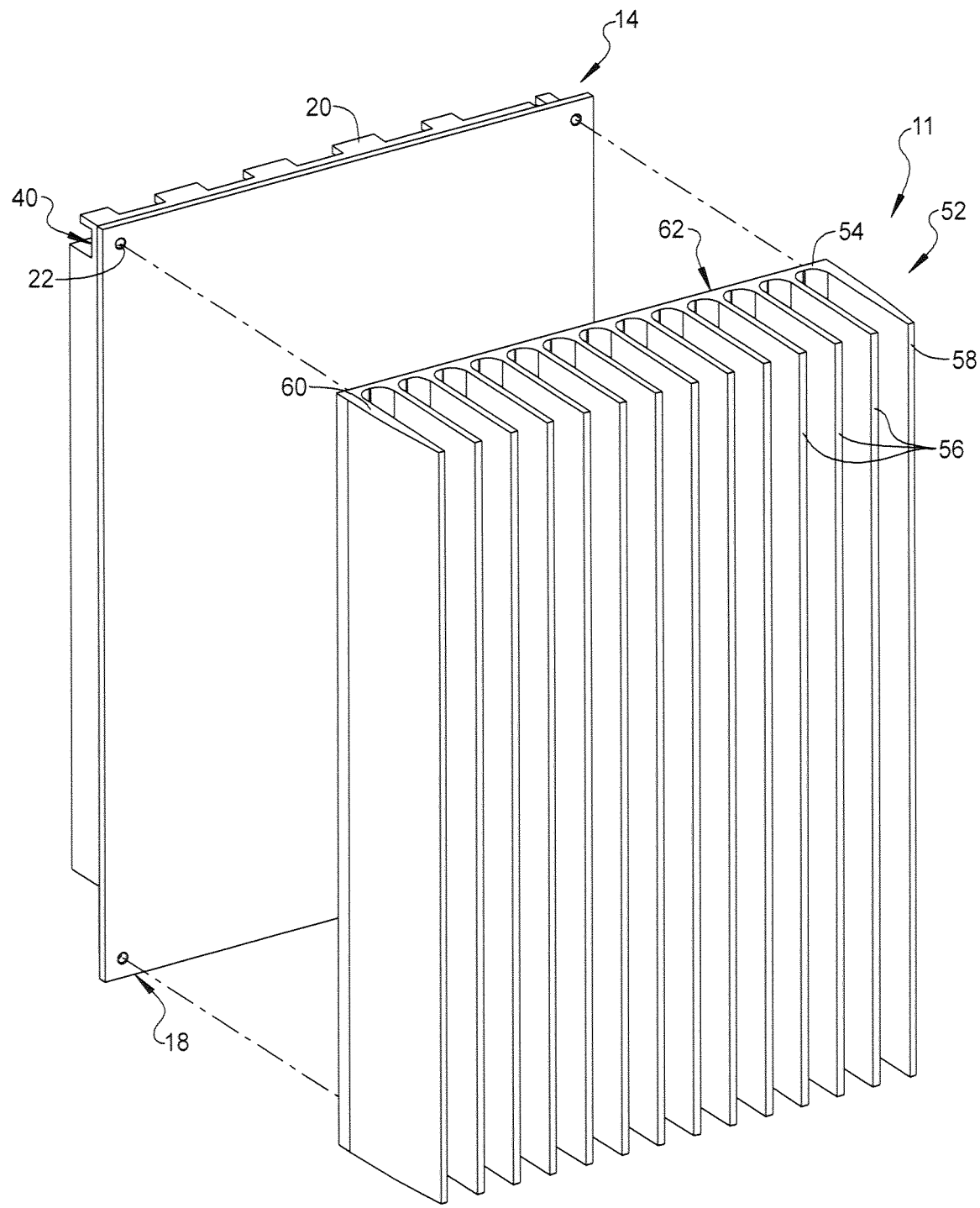
FIG. 3 is an exploded front left perspective view of the universal cabinet wall of FIG. 1 providing for removable/replaceable use of a convective cooling system.
Figure 4:
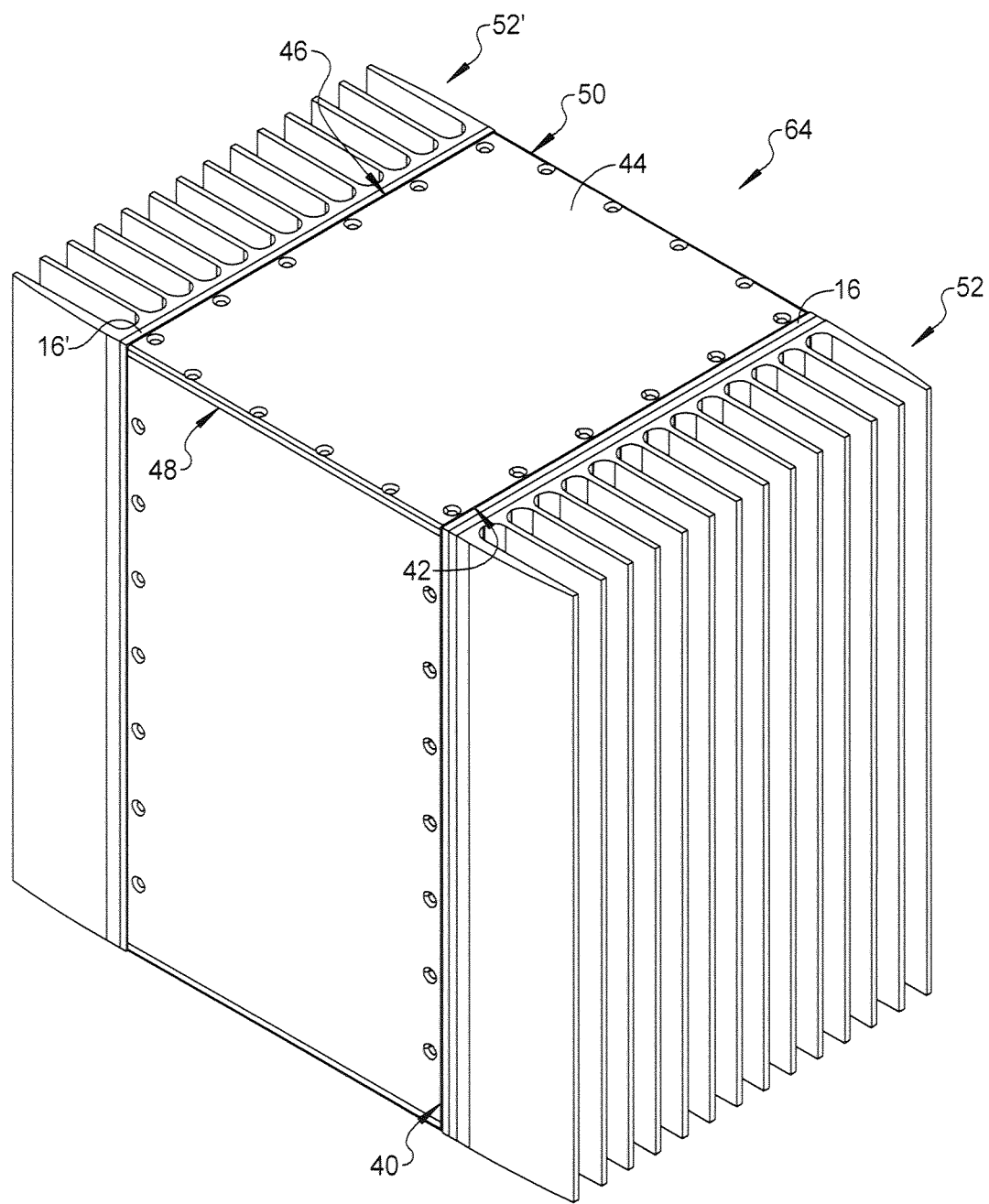
FIG. 4 is a front left perspective view of an assembled cabinet having the universal cabinet wall of FIG. 1 and the convective cooling system of FIG. 3 in an assembled condition.

Referring to FIG. 4 and again to FIGS. 1-3, a fully assembled convection cooled component cabinet 64 according to several embodiments includes first and second convection cooling members 52, 52' which are oppositely directed with respect to each other. It is noted that convection cooling members 52, similar to conduction cooling members 12, can also be mounted to different surfaces and in different configurations than those shown herein. For example, a conduction cooling member 12 or a convection cooling member 52 can also be releasably connected to a universal cabinet wall 14 positioned at the location shown for blank cabinet panel 48 to provide additional heat transfer capability for either conduction cooled component cabinet 41 or convection cooled component cabinet 64. Cooling members of the present disclosure can also be configured to adapt to either side, back, front, top, or bottom surfaces of the component cabinets such that substantially any surface of the component cabinet can be provided with cooling members. Again, as previously noted with respect to conduction cooled component cabinet 41, any of the convection cooling members 52 used for convection cooled component cabinet 64 are also removable when necessary for performance of maintenance on any of the internal components of the component cabinet.

A configurable electronics cabinet cooling system 10 of the present disclosure therefore includes a cabinet 41, 64 having multiple cabinet panels or walls 14, 44, 48 including at least one universal cabinet wall 14. The universal cabinet wall 14 has a planar outward facing surface 18 and multiple apertures 22. A heat transfer component 11 is releasably connected to the universal cabinet wall 14. The heat transfer component 11 is selected from either a conductive cooling member 12 or a convective cooling member 52 each adapted to be interchangeably and releasably connected to the universal cabinet wall 14 using fasteners 39 extending through same ones of the apertures 22. Each of the conductive cooling member 12 and the convective cooling member 52 includes a planar surface 38, 62, the planar surface 38, 62 adapted to directly contact the outward facing surface 18 of the universal cabinet wall 14.

The universal cabinet wall 14 defined herein, which is adapted to receive either a conduction cooling member 12 or a convection cooling member 52, provides several advantages. The ability to interchange conductive cooling members with convective cooling members and vice versa provides for adaptability in cooling the individual component cabinets of the present disclosure. A common component cabinet design having one or more of the universal cabinet walls 14 can therefore be used in multiple locations by interchanging only the cooling member, thereby providing common space envelopes for component cabinets of the present disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A configurable electronics cabinet cooling system, comprising:
   a cabinet including at least one universal cabinet wall having a planar outward facing surface and multiple apertures; and
   a conductive cooling member that primarily dissipates absorbed heat through conduction and a convective cooling member that primarily dissipates absorbed heat through convection, the universal cabinet wall configured so that both the conductive cooling member and the convective cooling member may be connected to the universal cabinet wall using same ones of the apertures, the conductive cooling member and the convective cooling member including a respective planar surface, the respective planar surface being coupled to directly contact the outward facing surface of the universal cabinet wall,
   wherein in a first configuration, one of the conductive cooling member and convective cooling member is connected to the universal cabinet wall and in a second configuration, the other of the conductive cooling member and convective cooling member is connected to the universal cabinet wall, where the electronics cabinet can be reconfigured between the first configuration and the second configuration, and wherein the universal cabinet wall is configured to receive either the conductive cooling member or the convective cooling member, wherein the conductive cooling member and the convective cooling member are adapted to be releasably connected to the universal cabinet wall, and wherein the conductive cooling member includes multiple conductive cooling channels projecting from a base and tapering to unconnected ends opposite the base, each of the multiple conductive cooling channels being contained entirely within the conductive cooling member and each of the multiple conductive cooling channels being spaced apart from an adjacent cooling channel by an air gap external to each projecting channel along the universal cabinet wall which when connected to a cooling header provides conduction cooling of the cabinet.

2. The configurable electronics cabinet cooling system of claim 1, wherein the conductive cooling member is in fluid communication with all of the conductive cooling channels.

3. The configurable electronics cabinet cooling system of claim 1, wherein each of the conductive cooling channels has a common channel width, a common channel base depth and a common channel end depth.

4. The configurable electronics cabinet cooling system of claim 3, wherein the channel end depth is less than the channel base depth.

5. The configurable electronics cabinet cooling system of claim 1, wherein the conductive cooling member includes first, second, third and fourth conductive cooling channels defining individual ones of the planar surface each aligned coplanar to the other cooling members.

6. The configurable electronics cabinet cooling system of claim 5, wherein each of the first, second, third and fourth conductive cooling channels has a common channel width, a common channel base depth and a common channel end depth.

7. A configurable electronics cabinet cooling system, comprising:
a cabinet having multiple walls including at least one universal cabinet wall, the universal cabinet wall having a planar outward facing surface and multiple apertures; and
a heat transfer component releasably connected to the universal cabinet wall, the heat transfer component including one of a conductive cooling member that substantially dissipates absorbed heat through conduction or a convective cooling member that substantially dissipates absorbed heat through convection, each of the conductive cooling member and the convective cooling member including a planar surface,
wherein the planar surface is coupled to directly contact the outward facing surface of the universal cabinet wall, wherein the conductive cooling member is interchangeable with the convective cooling member,
wherein the heat transfer component is adapted to be releasably connected to the universal cabinet wall and wherein in a first configuration, one of the conductive cooling member or convective cooling member is connected to the universal cabinet wall and in a second configuration, the other of the conductive cooling member or convective cooling member is connected to the universal cabinet wall, where the electronics cabinet can be reconfigured between the first configuration and the second configuration, and wherein the conductive cooling member includes multiple conductive cooling channels projecting from a base and tapering to unconnected ends opposite the base, each of the multiple conductive cooling channels being contained entirely within the conductive cooling member and each of the multiple conductive cooling channels being spaced apart from an adjacent cooling channel by an air gap external to each projecting channel and along the universal cabinet wall which when connected to a cooling header provides conduction cooling of the cabinet.

8. The configurable electronics cabinet cooling system of claim 7, wherein the convective cooling member includes a support plate having the planar surface oppositely directed with respect to multiple cooling fins.

9. The configurable electronics cabinet cooling system of claim 8, wherein the cooling fins are substantially identical to each other.

10. The configurable electronics cabinet cooling system of claim 7, wherein the universal cabinet wall further includes multiple component spacing members oppositely facing with respect to the planar surface.

11. The configurable electronics cabinet cooling system of claim 7, wherein each of the multiple conductive cooling channels has a channel planar face all aligned coplanar with each other such that each of the channel planar faces simultaneously contact the planar surface of the universal cabinet wall, each of the multiple conductive cooling channels being self contained and spaced apart by the air gap from the adjacent cooling channel along the universal cabinet wall.

12. A configurable electronics cabinet cooling system, comprising:
a cabinet having multiple walls; and
a cooling assembly, including:
a universal cabinet wall defining one of the multiple walls, the universal cabinet wall having a planar outward facing surface and multiple component spacing members oppositely facing with respect to the outward facing surface; and
a heat transfer component releasably connected to the outward facing surface of the universal cabinet wall, the heat transfer component including one of a conductive cooling member that substantially dissipates absorbed heat through conduction and a convective cooling member that substantially dissipates absorbed heat through convection, wherein the conductive cooling member is interchangeable with the convective cooling member to releasably connect to the universal cabinet wall in a same manner as the convective cooling member,
wherein the convective cooling member and the conductive cooling member are adapted to be releasably connected to the universal cabinet wall and wherein in a first configuration, one of the conductive cooling member and convective cooling member is connected to the universal cabinet wall and in a second configuration, the other of the conductive member and convective cooling member is connected to the universal cabinet wall, where the electronics cabinet can be reconfigured between the first configuration and the second configuration; and
wherein the conductive cooling member includes multiple conductive cooling channels projecting from a base and tapering to unconnected ends opposite the base, each of the multiple conductive cooling channels being contained entirely within the conductive cooling member and each of the multiple conductive cooling channels being spaced apart from an adjacent cooling channel by an air gap external to each projecting channel along the universal cabinet wall which when connected to a cooling header provides conduction cooling of the cabinet.

13. The configurable electronics cabinet cooling system of claim 12, wherein the multiple conductive cooling channels each have a planar face, all of the conductive cooling channel planar faces being in coplanar alignment with each other such that the coplanar faces all directly contact the outward facing surface of the universal cabinet wall.

* * * * *